(12) United States Patent
Zhang

(10) Patent No.: US 11,854,636 B2
(45) Date of Patent: Dec. 26, 2023

(54) DATA SAMPLING CIRCUIT AND SEMICONDUCTOR MEMORY

(71) Applicant: CHANGXIN MEMORY TECHNOLOGIES, INC., Hefei (CN)

(72) Inventor: Zhiqiang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 113 days.

(21) Appl. No.: 17/733,030

(22) Filed: Apr. 29, 2022

(65) Prior Publication Data

US 2023/0101821 A1   Mar. 30, 2023

(30) Foreign Application Priority Data

Sep. 27, 2021  (CN) .......................... 202111133806.4

(51) Int. Cl.
*G11C 29/00*   (2006.01)
*G11C 29/04*   (2006.01)

(52) U.S. Cl.
CPC ...... *G11C 29/04* (2013.01); *G11C 2029/0405* (2013.01)

(58) Field of Classification Search
CPC .......................... G11C 29/04; G11C 2029/0405
See application file for complete search history.

(56) References Cited

U.S. PATENT DOCUMENTS

| | | | | |
|---|---|---|---|---|
| 2005/0220089 A1* | 10/2005 | Kawashima | .......... | H04J 3/0608 370/535 |
| 2006/0077300 A1* | 4/2006 | Cheon | ................ | H04N 21/2383 348/614 |
| 2007/0147569 A1* | 6/2007 | Chang | .................. | H03L 7/0814 375/373 |
| 2009/0319245 A1* | 12/2009 | Ivchenko | ............. | G01D 5/2291 703/13 |

FOREIGN PATENT DOCUMENTS

CN            100546347 C       9/2009

* cited by examiner

Primary Examiner — Samir W Rizk
(74) Attorney, Agent, or Firm — Cooper Legal Group, LLC

(57) ABSTRACT

A data sampling circuit includes a frequency dividing circuit, a sampling circuit and a selection circuit. The frequency dividing circuit is configured to receive a first data sampling signal, and perform frequency dividing processing on the first data sampling signal to obtain multiple second data sampling signals associated with respective phases; the sampling circuit is configured to receive the multiple second data sampling signals and a first data signal, and sample the first data signal according to the multiple second data sampling signals to obtain multiple second data signals associated with respective phases; and the selection circuit is configured to receive preamble information and mode register set (MRS) information, and select among the multiple second data sampling signals and the plurality of second data signals according to the preamble information and the MRS information to obtain a target data sampling signal and a target data signal respectively.

18 Claims, 10 Drawing Sheets

DATA SAMPLING CIRCUIT AND SEMICONDUCTOR MEMORY

CROSS-REFERENCE TO RELATED APPLICATION

The application claims priority to Chinese Patent Application No. 202111133806.4, filed on Sep. 27, 2021, the disclosure of which is hereby incorporated herein by reference in its entirety.

BACKGROUND

With the continuous development of semiconductor technology, increasingly high requirements are imposed on data transmission speeds when devices such as computers are manufactured and used. In order to obtain a faster data transfer speed, a series of devices, such as memories in which the data can be transmitted at a Double Data Rate (DDR), are generated.

A Loopback function is currently proposed for Dynamic Random Access Memories (DRAMs) to rapidly test bit error rates of DRAM products.

SUMMARY

The present disclosure relates to the technical field of integrated circuits, and in particular, to a data sampling circuit and a semiconductor memory.

The present disclosure provides a data sampling circuit and a semiconductor memory, which can not only accurately identify phase information, but also rapidly test the bit error rate of the DRAM product.

According to a first aspect, an embodiment of the present disclosure provides a data sampling circuit including a frequency dividing circuit, a sampling circuit, and a selection circuit.

The frequency dividing circuit is configured to receive a first data sampling signal, and perform frequency dividing processing on the first data sampling signal to obtain the multiple second data sampling signals associated with respective phases.

The sampling circuit is configured to receive the multiple second data sampling signals and a first data signal, and sample the first data signal according to the multiple second data sampling signals to obtain the multiple second data signals associated with respective phases.

The selection circuit is configured to receive preamble information and mode register set (MRS) information, and select among the multiple second data sampling signals and the multiple second data signals according to the preamble information and the MRS information to obtain a target data sampling signal and a target data signal respectively.

Embodiments of the present disclosure provide a data sampling circuit and a semiconductor memory. The data sampling circuit includes a frequency dividing circuit, a sampling circuit and a selection circuit. The frequency dividing circuit is configured to receive a first data sampling signal, and perform frequency dividing processing on the first data sampling signal to obtain the multiple second data sampling signals associated with respective phases; the sampling circuit is configured to receive the multiple second data sampling signals and a first data signal, and sample the first data signal according to the multiple second data sampling signals to obtain the multiple second data signals associated with respective phases; and the selection circuit is configured to receive preamble information and mode register set (MRS) information, and select among the multiple second data sampling signals and the multiple second data signals according to the preamble information and the MRS information to obtain a target data sampling signal and a target data signal respectively. In this way, after the multiple second data sampling signals and the multiple second data signals are obtained, the signal corresponding to the target phase can be selected based on the preamble information and the MRS information, so that not only the phase information can be accurately identified, but also the bit error rate of the DRAM product can be rapidly tested.

DETAILED DESCRIPTION

Figure 1:
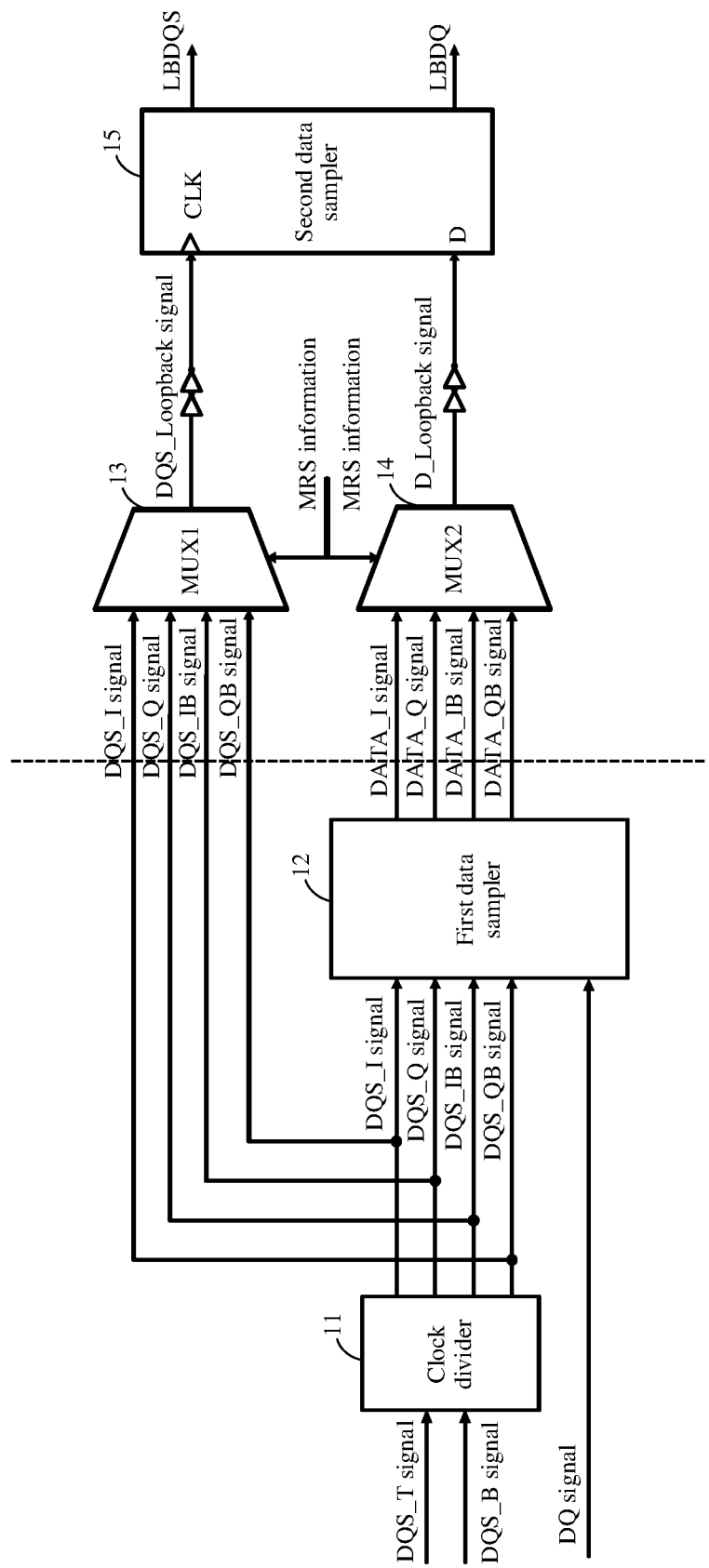
FIG. 1 is a schematic structural diagram of a data sampling circuit.

The technical solutions in the embodiments of this disclosure will be clearly and completely described below with reference to the accompanying drawings in the embodiments of the present disclosure. It will be appreciated that the specific embodiments described herein are intended only to explain the relevant disclosure and not to limit it. It is also to be noted that, for convenience of description, only the parts related to the related disclosure are shown in the drawings.

Unless otherwise defined, all technical and scientific terms used herein have the same meanings as generally understood by those skilled in the art belonging to the present disclosure. The terms used herein are for the purpose of describing embodiments of the present disclosure only and are not intended to limit this disclosure.

In the following description, "some embodiments" is referred to, which describe a subset of all possible embodiments, but it is understood that "some embodiments" may be the same subset or different subsets of all possible embodiments and can be combined with each other without conflict.

It is to be noted that the term "first\ second\ third" in the embodiments of the present disclosure is only used for distinguishing similar objects and does not represent a specific ranking for the objects, and it is understood that the "first\ second\ third" may interchange a specific order or sequence where possible to enable the embodiments of the present disclosure described herein to be implemented in an order other than that illustrated or described herein.

Before the embodiments of this disclosure are further described in detail, the nouns and terms involved in the embodiments of the present disclosure are described.

The nouns and terms involved in the embodiments of the present disclosure are applicable to the following explanation.

DRAM (Dynamic Random Access Memory).
SDRAM (Synchronous Dynamic Random Access Memory)
DDR (Double Data Rate)
DDR4 (4th DDR)
DDR5 (5th DDR)
CPU (Central Processing Unit)
CLK DIV (Clock Divider)
CWL (Column address strobe Write Latency)
MRS (Mode Register Set)

With the rapid development of semiconductor processes, the rate of the signal transmission becomes faster and faster. Moreover, with the continuous improvement of the processing capacity of the CPU, the requirements for the speed and capacity of the DDR are also continuously increased, and DDR5 has appeared in present. The maximum rate of DDR5 is expected to reach 8.4 GT/s, which is twice the maximum rate of DDR4. Simultaneously, the operating voltage is also reduced from 1.2 V to 1.1 V, which means that DDR5 further reduces power consumption while improving performance.

In addition, compared with DDR4, DDR5 has a new Loopback function. Specifically, in the DDR5 product, there is a registered clock driver (RCD) interface for outputting leveled data, and during the test, by using the RCD interface, the input signal can be compared with the final output signal from the RCD interface to obtain the bit error rate of the entire system. That is to say, the bit error rate of the DDR5 product can be rapidly tested by the Loopback function.

Referring to FIG. 1, it shows a schematic structural diagram of a data sampling circuit. The data sampling circuit includes a clock divider 11, a first data sampler 12, a first selector (MUX1) 13, a second selector (MUX2) 14 and a second data sampler 15. The two input signals of the clock divider 11 are a forward data sampling signal (represented by DQS_T) and a reverse data sampling signal (represented by DQS_B), and the phase difference between the DQS_T signal and the DQS_B signal is 180 degrees. After the operation of frequency dividing processing is performed on the DQS_T signal and the DQS_B signal by the clock divider 11, four data sampling signals (DQS_I signal, DQS_Q signal, DQS_IB signal and DQS_QB signal) with different phases may be output, specifically, a data sampling signal with a phase of 0 degree, a data sampling signal with a phase of 90 degrees, a data sampling signal with a phase of 180 degrees and a data sampling signal with a phase of 270 degrees. The four data sampling signals with different phases and the initial data signal (represented by DQ) are then input to the first data sampler 12, through which four data signals with different phases (DATA_I signal, DATA_Q signal, DATA_IB signal and DATA_QB signal) can be output, specifically, a data signal with a phase of 0 degree, a data signal with a phase of 90 degrees, a data signal with a phase of 180 degrees and a data signal with a phase of 270 degrees. The first selector 13 performs the phase selection on the DQS_I signal, the DQS_Q signal, the DQS_IB signal and the DQS_QB signal according to the mode register set information (i.e., the MRS information), to output the target data sampling signal (represented by DQS_Loopback). The second selector 14 performs the phase selection on the DATA_I signal, the DATA_Q signal, the DATA_IB signal and the DATA_QB signal, to output the target data signal (represented by D_Loopback). Furthermore, the DQS_Loopback signal and the D_Loopback signal may also be input to the second data sampler 15, and the D_Loopback signal is sampled by the DQS_Loopback signal to obtain a final data signal (represented by LBDQ) and a final clock signal (represented by LBDQS), which are compared with the input signal to determine the bit error rate.

Figure 2:
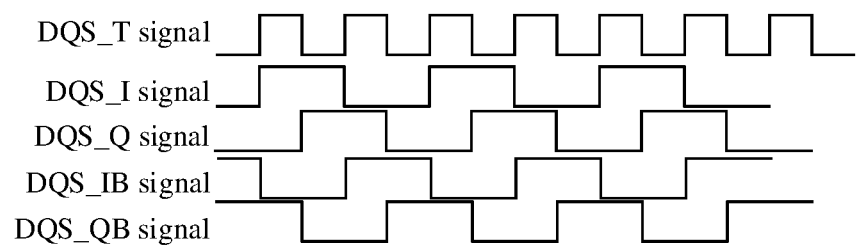
FIG. 2 is a diagram of a signal timing of a data sampling circuit.

According to the data sampling circuit shown in FIG. 1, referring to FIG. 2, it shows a diagram of a signal timing of the data sampling circuit. As shown in FIG. 2, there is provided a signal timing relationship between the forward data sampling signal (DQS_T signal) inputted from the clock divider 11 and the four data sampling signals with different phases (DQS_I signal, DQS_Q signal, DQS_IB signal and DQS_QB signal) outputted through the clock divider. Since the forward data sampling signal can also be considered as a clock signal, for the clock divider, the four data sampling signals with different phases output through the clock divider have a period twice that of the original forward data sampling signal. As can be seen from FIG. 2, there is a phase reverse relationship between the DQS_I signal and the DQS_IB signal, and a phase reverse relationship between the DQS_Q signal and the DQS_QB signal. For the forward data sampling signal, the DQS_I signal is output at a signal rising edge in the first clock cycle; the DQS_Q signal is output at a signal falling edge in the first clock cycle; the DQS_IB signal is output at a signal rising edge in the second clock cycle; and the DQS_QB signal is output at the falling edge in the second clock cycle. Thus, the phases of the DQS_I signal, the DQS_Q signal, the DQS_IB signal and the DQS_QB signal are different depending on the selection of the first clock cycle for the forward data sampling signal. For example, the phases of the DQS_I signal and the DQS_IB signal may be interchanged, and the phases of the DQS_Q signal and the DQS_QB signal may be interchanged.

That is to say, due to the presence of the clock divider, although four data sampling signals with different phases can be generated, correspondences between the sampling signals and their phases cannot be determined through the MRS information in the conventional scheme. That is, since the phases of the DQS_I signal, the DQS_Q signal, the DQS_IB signal and the DQS_QB signal are uncertain, the phases of the DQS_I signal and the DQS_IB signal actually output by the clock divider can be interchanged, and the phases of the DQS_Q signal and the DQS_QB signal can also be interchanged.

Based on this, an embodiment of the present disclosure provides a data sampling circuit including a frequency dividing circuit, a sampling circuit, and a selection circuit. The frequency dividing circuit is configured to receive a first data sampling signal, and perform frequency dividing processing on the first data sampling signal to obtain the multiple second data sampling signals associated with respective phases. The sampling circuit is configured to receive the multiple second data sampling signals and a first data signal, and sample the first data signal according to the multiple second data sampling signals to obtain the multiple second data signals associated with respective phases. The selection circuit is configured to receive preamble information and MRS information, and select among the multiple second data sampling signals and the multiple second data signals according to the preamble information and the MRS information to obtain a target data sampling signal and a target data signal respectively. In this way, after the multiple second data sampling signals and the multiple second data signals are obtained, the signal corresponding to the target phase can be selected according to the preamble information and the MRS information, which not only solves the problem of phase uncertainty caused by the clock divider, but also enables accurate identification of the phase information and rapid test of the bit error rate of the DRAM product.

Hereinafter, embodiments of the present disclosure will be described in detail with reference to the accompanying drawings.

Figure 3:
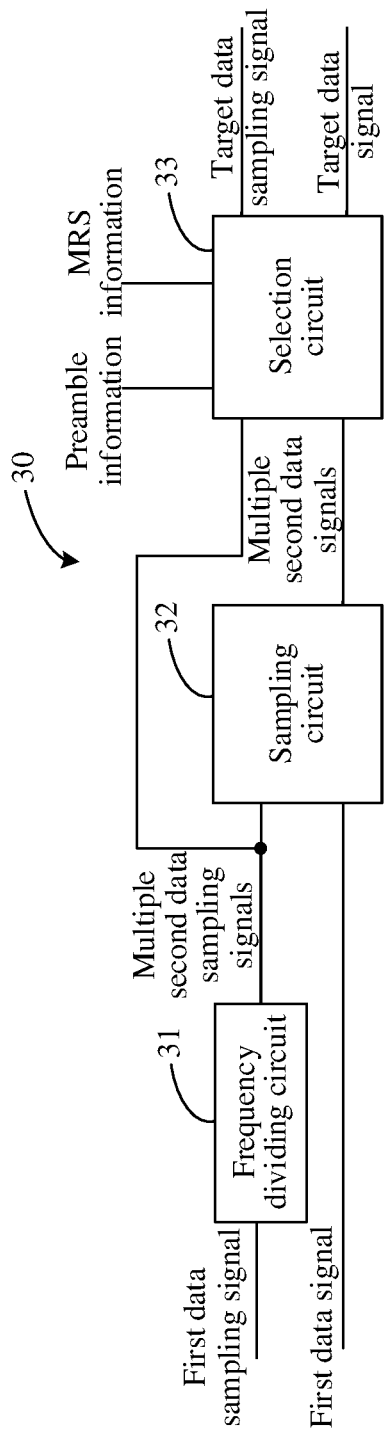
FIG. 3 is a schematic structural diagram of a data sampling circuit according to an embodiment of the present disclosure.

In an embodiment of the present disclosure, referring to FIG. 3, it shows a schematic structural diagram of a data sampling circuit 30 according to an embodiment of the present disclosure. As shown in FIG. 3, the data sampling circuit 30 may include the frequency dividing circuit 31, the sampling circuit 32, and the selection circuit 33.

The frequency dividing circuit 31 is configured to receive a first data sampling signal, and perform frequency dividing processing on the first data sampling signal to obtain the multiple second data sampling signals associated with respective phases.

The sampling circuit 32 is configured to receive the multiple second data sampling signals and a first data signal, and sample the first data signal according to the multiple second data sampling signals to obtain the multiple second data signals associated with respective phases.

The selection circuit 33 is configured to receive preamble information and MRS information, and select among the multiple second data sampling signals and the multiple second data signals according to the preamble information and the MRS information to obtain a target data sampling signal and a target data signal respectively.

It is to be noted that, in the embodiments of the present disclosure, the data sampling circuit 30 may be used for implementing a Loopback function, that is, the data sampling circuit 30 may be considered as a part of a circuit for implementing the Loopback function. Herein, in order to be able to accurately identify the phase information, in the embodiments of the present disclosure, in addition to using the MRS information for phase selection, preamble information is also involved to assist in the phase selection, so that the target data sampling signal and the target data signal that are finally required can be selected.

It is also to be noted that, for the frequency dividing circuit 31, the multiple second data sampling signals output therefrom herein are generally referred to four second data sampling signals that in particular may include a second data sampling signal associated with a first phase, a second data sampling signal associated with a second phase, a second data sampling signal associated with a third phase and a second data sampling signal associated with a fourth phase.

It is also to be noted that, for the sampling circuit 32, the multiple second data signals output therefrom herein are generally referred to four second data signals that in particular may include a second data signal associated with a first phase, a second data signal associated with a second phase, a second data signal associated with a third phase and a second data signal associated with a fourth phase.

In the embodiments of the present disclosure, the second data sampling signal associated with the first phase may be represented by DQS_I, the second data sampling signal associated with the second phase may be represented by DQS_Q, the second data sampling signal associated with the third phase may be represented by DQS_IB, and the second data sampling signal associated with the fourth phase may be represented by DQS_QB. The second data signal associated with the first phase may be represented by DATA_I, the second data signal associated with the second phase may be represented by DATA_Q, the second data signal associated with the third phase may be represented by DATA_IB, and the second data signal associated with the fourth phase may be represented by DATA_QB.

In a specific embodiment, the first phase is 0 degree, the second phase is 90 degrees, the third phase is 180 degrees, and the fourth phase is 270 degrees.

That is to say, for the first data sampling signal and the first data signal, after passing through the frequency dividing circuit 31 and the sampling circuit 32, four second data sampling signal with different phases and four second data signals with different phases can be obtained, respectively. The four second data sampling signals are specifically the DQS_I signal, the DQS_Q signal, the DQS_IB signal and the DQS_QB signal, and the phases of the four second data sampling signals are 0 degree, 90 degrees, 180 degrees and 270 degrees respectively. The four second data signals are specifically the DATA_I signal, the DATA_Q signal, the DATA_IB signal and the DATA_QB signal, and the phases of the four second data signals are 0 degree, 90 degrees, 180 degrees and 270 degrees respectively. In other words, the embodiments of the present disclosure can realize frequency division of the first data sampling signal and the first data signal, and the four phases corresponding to the frequency-divided signals are 0 degree, 90 degrees, 180 degrees and 270 degrees.

Figure 4:
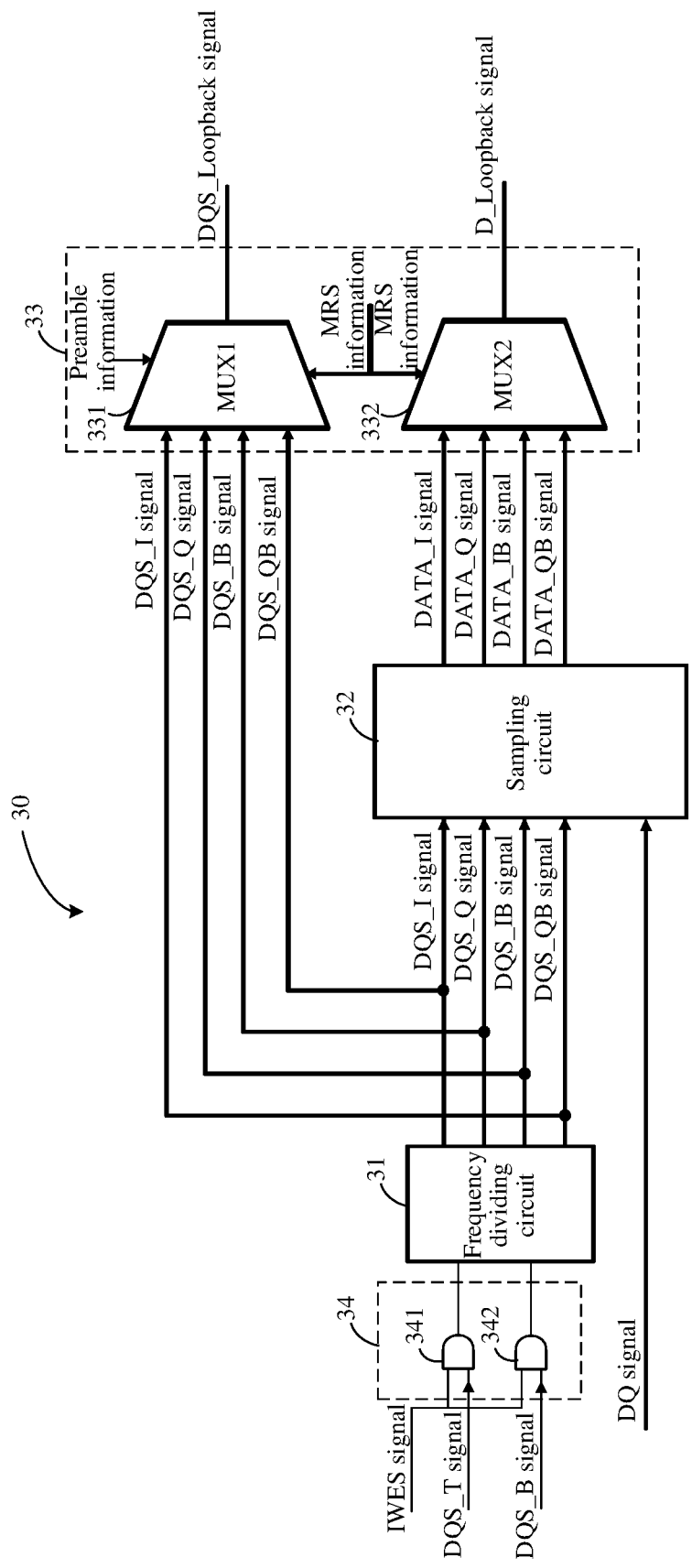
FIG. 4 is a schematic structural diagram of another data sampling circuit according to an embodiment of the present disclosure.

In some embodiments, based on the data sampling circuit 30 shown in FIG. 3, referring to FIG. 4, the data sampling circuit 30 may further include an enable control circuit 34 connected to the frequency dividing circuit 31.

The enable control circuit 34 is configured to receive an initial data sampling signal and a write enable signal, and perform a logic operation on the initial data sampling signal and the write enable signal to obtain the first data sampling signal.

In an embodiment of the present application, the first data sampling signal may include the first forward data sampling signal and the first complementary data sampling signal. That is to say, in some embodiments, the enable control circuit 34 is specifically configured to generate the first forward data sampling signal and the first complementary data sampling signal when the write enable signal is in a first level state.

It is to be noted that, in this embodiment, the first level state is a high level state and the second level state is a low level state. For the write enable signal represented by IWES, it is a write enable signal internally required after a write leveling operation. Herein, the write leveling operation may adjust the relative position between the first data sampling signal and the clock signal so that the edge of the first data sampling signal aligns with the edge of the clock signal, that is, when the IWES signal is in the high-level state, an initial phase state is provided for the frequency dividing circuit so as to facilitate subsequent accurate identification of the phase information.

It is to be noted that, in the embodiment of the present application, for the first forward data sampling signal and the first complementary data sampling signal, a phase difference therebetween is 180 degrees. Accordingly, for the initial data sampling signal, the initial data sampling signal may include a forward data sampling signal and a complementary data sampling signal, and a phase difference between the forward data sampling signal and the complementary data sampling signal is also 180 degrees.

Furthermore, in some embodiments, referring to FIG. 4, the enable control circuit may include a first AND gate 341 and a second AND gate 342.

The first AND gate 341 is configured to receive the forward data sampling signal and the write enable signal, and perform an AND operation on the forward data sampling signal and the write enable signal to obtain the first forward data sampling signal.

The second AND gate 342 is configured to receive the complementary data sampling signal and the write enable signal, and perform an AND operation on the complementary data sampling signal and the write enable signal to obtain the first complementary data sampling signal.

It is to be noted that the forward data sampling signal may be represented by DQS_T and the complementary data sampling signal may be represented by DQS_B.

That is to say, for the initial data sampling signal, the AND operation can be performed on it and the IWES signal by using the first AND gate 341 and the second AND gate 342, the first data sampling signal (including the first forward data sampling signal and the first reverse data sampling signal) obtained when the IWES signal is in the high-level state is provided to the frequency dividing circuit 31, so as to provide an initial state for the frequency dividing circuit 31, so that the phase information can be accurately identified subsequently according to the preamble information and the MRS information.

Furthermore, in some embodiments, based on the data sampling circuit 30 shown in FIG. 3, referring to FIG. 4, the selection circuit 33 may further include a first selection module 331 and a second selection module 332.

The first selection module 331 is configured to receive the preamble information and the MRS information, and select among the multiple second data sampling signals respectively according to the preamble information and the MRS information to obtain the target data sampling signal.

The second selection module 332 is configured to receive the preamble information and the MRS information, and select among the multiple second data signals respectively according to the preamble information and the MRS information to obtain the target data signal.

It is to be noted that the first selection module 331 may be represented by MUX1 and the second selection module 332 may be represented by MUX2. In addition, the preamble information may be represented by Preamble Information, and the mode register set information may be represented by MRS information, in particular MR53:OP[6:5]. In the embodiments of the present disclosure, both the target data sampling signal and the target data signal are obtained through two times of selection by using the preamble information and the MRS information.

Figure 5:
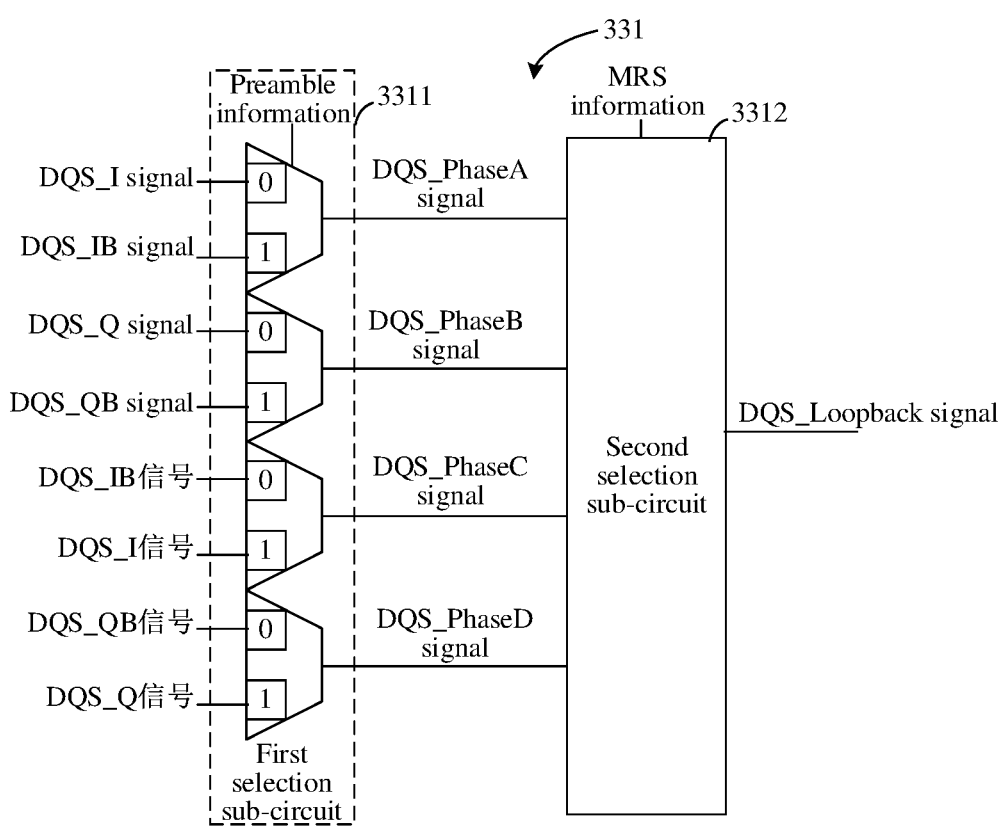
FIG. 5 is a schematic structural diagram of a first selection module according to an embodiment of the present disclosure.

Furthermore, for the target data sampling signal, in some embodiments, referring to FIG. 5, the first selection module 331 may include a first selection sub-module 3311 and a second selection sub-module 3312.

A first selection sub-module 3311 is configured to receive the preamble information, and select among the multiple second data sampling signals according to the preamble information to obtain second data sampling signals respectively corresponding to phases A, B, C and D.

The second selection sub-module 3312 is configured to receive the MRS information, select among the second data sampling signals respectively corresponding to the phases A, B, C and D according to the MRS information, and take a selected second data sampling signal corresponding to a target phase as the target data sampling signal.

It is to be noted that, in FIG. 5, the second data sampling signal corresponding to the phase A may be represented by DQS_PhaseA, the second data sampling signal corresponding to the phase B may be represented by DQS_PhaseB, the second data sampling signal corresponding to the phase C may be represented by DQS_PhaseC, and the second data sampling signal corresponding to the phase D may be represented by DQS_PhaseD. Specifically, as shown in FIG. 5, the first selection sub-module 3311 may further include four selectors: a first selector, a second selector, a third selector, and a fourth selector, respectively. Inputs of the first selector are the DQS_I signal and the DQS_IB signal, and an output of the first selector is the DQS_PhaseA signal; inputs of the second selector are the DQS_Q signal and the DQS_QB signal, and an output of the second selector is the DQS_PhaseB signal; inputs of the third selector are the DQS_IB signal and the DQS_I signal, and an output of the third selector is the DQS_PhaseC signal; and inputs of the fourth selector are the DQS_QB signal and the DQS_Q signal, and an output of the fourth selector is the DQS_PhaseD signal. Then, after the DQS_PhaseA signal, the DQS_PhaseB signal, the DQS_PhaseC signal and the DQS_PhaseD signal are input to the second selection sub-module 3312, the target data sampling signal finally output, which is determined based on the MRS information, may be represented by DQS_Loopback.

That is to say, in the embodiment of the present disclosure, a selection is made according to the preamble information to determine the second data sampling signals respectively corresponding to the phases A, B, C and D. Then, a selection is made according to the MRS information to determine the target phase, to further obtain the target data sampling signal (that is, the second data sampling signal corresponding to the target phase). It can be seen that the embodiments of the present disclosure can solve the problem of phase uncertainty caused by the clock divider, so that the target phase and the corresponding target data sampling signal can be accurately identified.

Furthermore, in the first selection sub-module 3311, depending on different preamble modes indicated by the preamble information, the second data sampling signals respectively corresponding to phases A, B, C and D are also different. In the embodiment of the present disclosure, the preamble mode indicated by the preamble information may include a first preamble mode, a second preamble mode and a third preamble mode. The second data sampling signals respectively corresponding to the phases A, B, C and D in the three preamble modes will be described below.

In a possible embodiment, the first selection sub-module 3311 is specifically configured to, when the preamble information is used for indicating a first preamble mode, determine that the second data sampling signals respectively corresponding to the phases A, B, C and D are the second data sampling signal associated with the third phase, the second data sampling signal associated with the fourth phase, the second data sampling signal associated with the first phase, and the second data sampling signal associated with the second phase.

Or, in another possible embodiment, the first selection sub-module 3311 is specifically configured to, when the preamble information is used for indicating a second preamble mode, determine that the second data sampling signals respectively corresponding to the phases A, B, C and D are the second data sampling signal associated with the third phase, the second data sampling signal associated with the fourth phase, the second data sampling signal associated with the first phase, and the second data sampling signal associated with the second phase.

Or, in yet another possible embodiment, the first selection sub-module 3311 is specifically configured to, when the preamble information is used for indicating a third preamble mode, determine that the second data sampling signals respectively corresponding to the phases A, B, C and D are the second data sampling signal associated with the first phase, the second data sampling signal associated with the second phase, the second data sampling signal associated with the third phase, and the second data sampling signal associated with the fourth phase.

It is to be noted that the second data sampling signal associated with the first phase may be represented by DQS_I, the second data sampling signal associated with the second phase may be represented by DQS_Q, the second data sampling signal associated with the third phase may be represented by DQS_IB, and the second data sampling signal associated with the fourth phase may be represented by DQS_QB. Thus, the phase relationships between the phases A, B, C and D and the second data sampling signals in the different preamble modes are shown in Table 1.

TABLE 1

| Preamble information | Phase A | Phase B | Phase C | Phase D |
|---|---|---|---|---|
| First preamble mode | DQS_IB | DQS_QB | DQS_I | DQS_Q |
| Second preamble mode | DQS_IB | DQS_QB | DQS_I | DQS_Q |
| Third preamble mode | DQS_I | DQS_Q | DQS_IB | DQS_QB |

That is to say, according to the phase relationships shown in Table 1, after the preamble mode indicated by the preamble information is determined, the initial state, that is, the second data sampling signal corresponding to the phase A, can be determined according to the determined preamble mode, and then the second data sampling signals respectively corresponding to the phases A, B, C and D can be determined, so that the target phase and the corresponding target data sampling signal can be accurately identified subsequently based on the MRS information.

It is to be further noted that, in the second selection sub-module 3312, depending on different values of the MRS information, the target phase is also different. In the embodiment of the present disclosure, the value of the MRS information may include a first value, a second value, a third value and a fourth value. The target phase obtained under the four values and the corresponding target data sampling signal will be separately described below.

In a possible embodiment, the second selection sub-module 3312 is specifically configured to, when the MRS information has a first value, determine that the target phase is the phase A, and take the second data sampling signal corresponding to the phase A as the target data sampling signal.

Or, in another possible embodiment, the second selection sub-module 3312 is specifically configured to, when the MRS information has a second value, determine that the target phase is the phase B, and take the second data sampling signal corresponding to the phase B as the target data sampling signal.

Or, in yet another possible embodiment, the second selection sub-module 3312 is specifically configured to, when the MRS information has a third value, determine that the target phase is the phase C, and take the second data sampling signal corresponding to the phase C as the target data sampling signal.

Or, in still another possible embodiment, the second selection sub-module 3312 is specifically configured to, when the MRS information has a fourth value, determine that the target phase is the phase D, and take the second data sampling signal corresponding to the phase D as the target data sampling signal.

It is to be noted that, in the embodiments of the present disclosure, the first value is 00, the second value is 01, the third value is 10, and the fourth value is 11. In this way, when the value of the MRS information is different, the correspondences between the value and the target phase are shown in Table 2.

TABLE 2

| Function | Register Type | Operand | Correspondence (Data) |
|---|---|---|---|
| Phase selection | R/W | OP[6:5] | 00: Corresponding to a selection of phase A<br>01: Corresponding to a selection of phase B<br>10: Corresponding to a selection of phase C<br>11: Corresponding to a selection of phase D |

Exemplarily, when the value of the MRS information is 00, the target phase is the phase A, and the second data sampling signal corresponding to the phase A is the target data sampling signal. In a case where the preamble information is used for indicating the first preamble mode or the second preamble mode, the target data sampling signal is the second data sampling signal associated with the third phase, that is, the DQS_IB signal; and in a case where the preamble information is used for indicating the third preamble mode, the target data sampling signal is the second data sampling signal associated with the first phase, that is, the DQS_I signal.

Exemplarily, when the value of the MRS information is 01, the target phase is the phase B, and the second data sampling signal corresponding to the phase B is the target data sampling signal. In a case where the preamble information is used for indicating the first preamble mode or the second preamble mode, the target data sampling signal is the second data sampling signal associated with the fourth phase, that is, the DQS_QB signal; and in a case where the preamble information is used for indicating the third preamble mode, the target data sampling signal is the second data sampling signal associated with the second phase, that is, the DQS_Q signal.

Exemplarily, when the value of the MRS information is 10, the target phase is the phase C, and the second data sampling signal corresponding to the phase C is the target data sampling signal. In a case where the preamble information is used for indicating the first preamble mode or the second preamble mode, the target data sampling signal is the second data sampling signal associated with the first phase, that is, the DQS_I signal; and in a case where the preamble information is used for indicating the third preamble mode, the target data sampling signal is the second data sampling signal associated with the third phase, that is, the DQS_IB signal.

Exemplarily, when the value of the MRS information is 11, the target phase is the phase D, and the second data sampling signal corresponding to the phase D is the target data sampling signal. In a case where the preamble information is used for indicating the first preamble mode or the second preamble mode, the target data sampling signal is the second data sampling signal associated with the second phase, that is, the DQS_Q signal; and in a case where the preamble information is used for indicating the third preamble mode, the target data sampling signal is the second data sampling signal associated with the fourth phase, that is, the DQS_QB signal.

In this way, for the multiple second data sampling signals, after the preamble mode indicated by the preamble information is determined, the initial state, that is, the second data sampling signal corresponding to the phase A, can be determined according to the determined preamble mode, then the second data sampling signals respectively corresponding to the phases A, B, C and D can be determined, and then the target phase can be determined according to the value of the MRS information, so as to obtain the target data sampling signal. Thus, the selection of the target data sampling signal according to the preamble information and the MRS information not only solves the problem of phase uncertainty caused by the clock divider, but also enables accurate identification of the phase information and rapid test of the bit error rate of the DRAM product.

Figure 6:
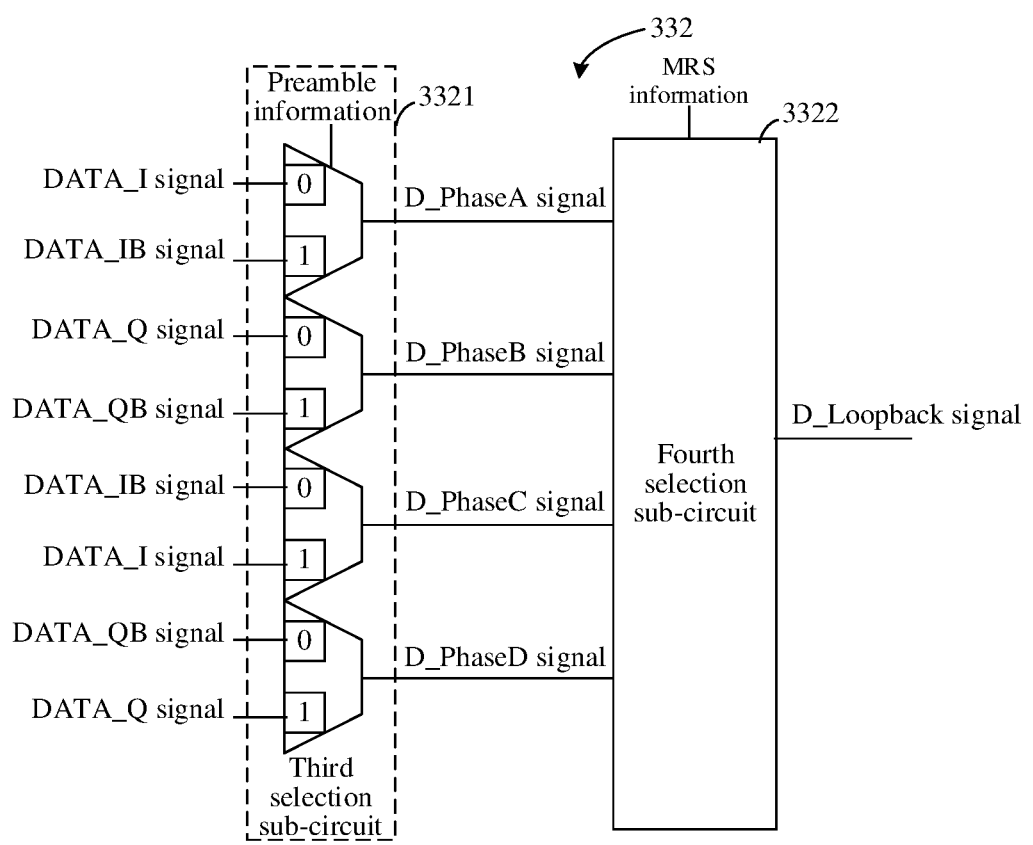
FIG. 6 is a schematic structural diagram of a second selection module according to an embodiment of the present disclosure.

Furthermore, for the target data signal, in some embodiments, referring to FIG. 6, the second selection module 332 may include a third selection sub-module 3321 and a fourth selection sub-module 3322.

The third selection sub-module 3321 is configured to receive the preamble information, and select among the multiple second data signals according to the preamble information to obtain second data signals respectively corresponding to phases A, B, C and D.

The fourth selection sub-module 3322 is configured to receive the MRS information, select among the second data signals respectively corresponding to the phases A, B, C and D according to the MRS information, and take a selected second data signal corresponding to the target phase as the target data signal.

It is to be noted that, in FIG. 6, the second data signal corresponding to the phase A may be represented by D_PhaseA, the second data signal corresponding to the phase B may be represented by D_PhaseB, the second data signal corresponding to the phase C may be represented by D_PhaseC, and the second data signal corresponding to the phase D may be represented by D_PhaseD. Specifically, as shown in FIG. 6, the third selection sub-module 3321 may further include four selectors: a fifth selector, a sixth selector, a seventh selector, and an eighth selector, respectively. Inputs of the fifth selector are the DATA_I signal and the DATA_IB signal, and an output of the fifth selector is the D_PhaseA signal; inputs of the sixth selector are the DATA_Q signal and the DATA_QB signal, and an output of the sixth selector is the D_PhaseB signal; inputs of the seventh selector are the DATA_IB signal and the DATA_I signal, and an output of the seventh selector is the D_PhaseC signal; and inputs of the eighth selector are the DATA_QB signal and the DATA_Q signal, and the output is the D_PhaseD signal. Then, after the D_PhaseA signal, the D_PhaseB signal, the D_PhaseC signal and the D_PhaseD signal are input to the fourth selection sub-module 3322, the target data signal finally output, which is determined based on the MRS information, may be represented by D_Loopback.

That is to say, in the embodiment of the present disclosure, a selection is made according to the preamble information to determine the second data signals respectively corresponding to the phases A, B, C and D. Then, a selection is made according to the MRS information to determine the target phase, to further obtain the target data signal (that is, the second data signal corresponding to the target phase). It can be seen that the embodiments of the present disclosure can solve the problem of phase uncertainty caused by the clock divider, so that the target phase and the corresponding target data sampling signal can be accurately identified.

Furthermore, in the third selection sub-module 3321, depending on different preamble modes indicated by the preamble information, the second data signals respectively corresponding to phases A, B, C and D are also different. In the embodiment of the present disclosure, the preamble mode indicated by the preamble information may include the first preamble mode, the second preamble mode and the third preamble mode. The second data signals respectively corresponding to the phases A, B, C and D in the three preamble modes will be described below.

In a possible embodiment, the third selection sub-module 3321 is specifically configured to, when the preamble information is used for indicating a first preamble mode, determine that the second data signals respectively corresponding to the phases A, B, C and D are the second data signal associated with the third phase, the second data signal associated with the fourth phase, the second data signal associated with the first phase, and the second data signal associated with the second phase.

Or, in another possible embodiment, the third selection sub-module 3321 is specifically configured to, when the preamble information is used for indicating a second preamble mode, determine that the second data signals respectively corresponding to the phases A, B, C and D are the second data signal associated with the third phase, the second data signal associated with the fourth phase, the second data signal associated with the first phase, and the second data signal associated with the second phase.

Or, in yet another possible embodiment, the third selection sub-module 3321 is specifically configured to, when the preamble information is used for indicating a third preamble mode, determine that the second data signals respectively corresponding to the phases A, B, C and D are the second data signal associated with the first phase, the second data signal associated with the second phase, the second data signal associated with the third phase, and the second data signal associated with the fourth phase.

It is to be noted that the second data signal associated with the first phase may be represented by DATA_I, the second data signal associated with the second phase may be represented by DATA_Q, the second data signal associated with the third phase may be represented by DATA_IB, and the second data signal associated with the fourth phase may be represented by DATA_QB. Thus, the phase relationships between the phases A, B, C and D and the second data signals in the different preamble modes are shown in Table 3.

TABLE 3

| Preamble information | Phase A | Phase B | Phase C | Phase D |
|---|---|---|---|---|
| First preamble mode | DATA_IB | DATA_QB | DATA_I | DATA_Q |

TABLE 3-continued

| Preamble information | Phase A | Phase B | Phase C | Phase D |
|---|---|---|---|---|
| Second preamble mode | DATA_IB | DATA_QB | DATA_I | DATA_Q |
| Third preamble mode | DATA_I | DATA_Q | DATA_IB | DATA_QB |

That is to say, according to the phase relationships shown in Table 3, after the preamble mode indicated by the preamble information is determined, the initial state, that is, the second data signal corresponding to the phase A can be determined according to the determined preamble mode, and then the second data signals respectively corresponding to the phases A, B, C and D can be determined, so that the target phase and the corresponding target data signal can be accurately identified subsequently based on the MRS information.

It is to be further noted that, in the fourth selection sub-module 3322, depending on different values of the MRS information, the target phase is also different. In the embodiment of the present disclosure, the value of the MRS information may include a first value, a second value, a third value and a fourth value. The target phase obtained under the four values and the corresponding target data signal will be separately described below.

In a possible embodiment, the fourth selection sub-module 3322 is specifically configured to, when the MRS information has a first value, determine that the target phase is the phase A, and take the second data signal corresponding to the phase A as the target data signal.

Or, in another possible embodiment, the fourth selection sub-module 3322 is specifically configured to, when the MRS information has a second value, determine that the target phase is the phase B, and take the second data signal corresponding to the phase B as the target data signal.

Or, in still another possible embodiment, the fourth selection sub-module 3322 is specifically configured to, when the MRS information has a third value, determine that the target phase is the phase C, and use the second data signal corresponding to the phase C as the target data signal.

Or, in still another possible embodiment, the fourth selection sub-module 3322 is specifically configured to, when the MRS information has a fourth value, determine that the target phase is the phase D, and take the second data signal corresponding to the phase D as the target data signal.

It is to be noted that, in the embodiments of the present disclosure, the first value is 00, the second value is 01, the third value is 10, and the fourth value is 11. In this way, when the value of the MRS information is different, the correspondences between the value and the target phase are as shown in Table 2 above.

Exemplarily, when the value of the MRS information is 00, the target phase is the phase A, and the second data signal corresponding to the phase A is the target data signal. In a case where the preamble information is used for indicating the first preamble mode or the second preamble mode, the target data signal is the second data signal associated with the third phase, that is, the DATA_IB signal; and in a case where the preamble information is used for indicating the third preamble mode, the target data signal is the second data signal associated with the first phase, that is, the DATA_I signal.

Exemplarily, when the value of the MRS information is 01, the target phase is the phase B, and the second data signal corresponding to the phase B is the target data signal. In a case where the preamble information is used for indicating the first preamble mode or the second preamble mode, the target data signal is the second data signal associated with the fourth phase, that is, the DATA_QB signal; and in a case where the preamble information is used for indicating the third preamble mode, the target data signal is the second data signal associated with the second phase, that is, the DATA_Q signal.

Exemplarily, when the value of the MRS information is 10, the target phase is the phase C, and the second data signal corresponding to the phase C is the target data sampling signal. In a case where the preamble information is used for indicating the first preamble mode or the second preamble mode, the target data signal is the second data signal associated with the first phase, that is, the DQS_I signal; and in a case where the preamble information is used for indicating the third preamble mode, the target data signal is the second data signal associated with the third phase, that is, the DQS_IB signal.

Exemplarily, when the value of the MRS information is 11, the target phase is the phase D, and the second data signal corresponding to the phase D is the target data signal. In a case where the preamble information is used for indicating the first preamble mode or the second preamble mode, the target data signal is the second data signal associated with the second phase, that is, the DQS_Q signal; and in a case where the preamble information is used for indicating the third preamble mode, the target data signal is the second data signal associated with the fourth phase, that is, the DQS_QB signal.

In this way, for the multiple second data signals, after the preamble mode indicated by the preamble information is determined, the initial state, that is, the second data signal corresponding to the phase A, can be determined according to the determined preamble mode, then the second data signals respectively corresponding to the phases A, B, C and D can be determined, and then the target phase can be determined according to the value of the MRS information, so as to obtain the target data signal. Thus, the selection of the target data signal according to the preamble information and the MRS information not only solves the problem of phase uncertainty caused by the clock divider, but also enables accurate identification of the phase information and rapid test of the bit error rate of the DRAM product.

Furthermore, in some embodiments, the three preamble modes are as follows.

The first preamble mode is a preamble mode with 2 clock cycles.

The second preamble mode is a preamble mode with 3 clock cycles.

The third preamble mode is a preamble mode with 4 clock cycles.

In the embodiment of the present disclosure, in the first preamble mode, the preamble mode with 2 clock cycles may include a static signal with 1 clock cycle and an oscillation signal with one clock cycle. In the second preamble mode, the preamble mode with 3 clock cycles may include a static signal with 2 clock cycles and an oscillation signal with 1 clock cycle. In the third preamble mode, the preamble mode with 4 clock cycles may include a static signal with 2 clock cycles and an oscillation signal with 2 clock cycles.

Figure 7:
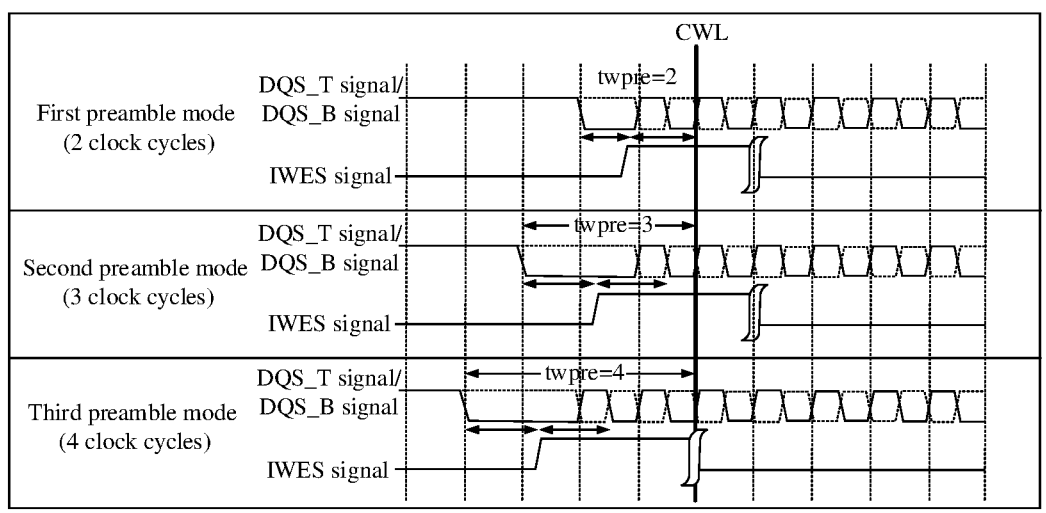
FIG. 7 is a diagram of a signal timing of a write enable signal and an initial data sampling signal in different preamble modes according to an embodiment of the present disclosure.

Referring to FIG. 7 for details, it shows a diagram of a signal timing of a write enable signal and an initial data sampling signal in different preamble modes according to an embodiment of the present disclosure. As shown in FIG. 7, the CWL represents a latency between a column address strobe (CAS) write command and data, that is, after the operation of sending the write command, the first data will not arrive until the CWL has elapsed. In other words, CWL represents the arrival time of the first data after the operation of sending the write command. As can be seen from FIG. 7, for the first preamble mode, since it includes the static signal with 1 clock cycle and the oscillation signal with 1 clock cycle, i.e., twpre=2, when the write enable signal is at the high level, the initial data sampling signal is provided to the frequency dividing circuit, which means that the signal rising edge in the first clock cycle, i.e., the position of the DQS_I signal, is fixed for the frequency dividing circuit; then, when the first data arrives, the first data is the DQS_IB signal or the DATA_IB signal (that is, the second data sampling signal corresponding to the phase A is the DQS_IB signal, and the second data signal corresponding to phase A is the DATA_IB signal). For the second preamble mode, since it includes a static signal with two clock cycles and an oscillation signal with 1 clock cycle, i.e., twpre=3, when the write enable signal is at the high level, the initial data sampling signal is also provided to the frequency dividing circuit, and when the first data arrives, the first data is still the DQS_IB signal or the DATA_IB signal (that is, the second data sampling signal corresponding to the phase A is the DQS_IB signal, and the second data signal corresponding to phase A is the DATA_IB signal). For the third preamble mode, since it includes the static signal with two clock cycles and the oscillation signal with two clock cycles, i.e., twpre=4, when the write enable signal is at the high level, the initial data sampling signal is also provided to the frequency dividing circuit, and when the first data arrives, the first data is the DQS_I signal or the DATA_I signal (that is, the second data sampling signal corresponding to the phase A is the DQS_I signal, and the second data signal corresponding to the phase A is the DATA_I signal).

Thus, according to FIG. 7, not only the phase relationships between the phases A, B, C and D and the second data sampling signals as shown in Table 1 can be established, but also the phase relationships between the phases A, B, C and D and the second data signals as shown in Table 3 can be established, so that the target phase and the corresponding target data signal can be accurately identified subsequently based on the MRS information.

Figure 8:
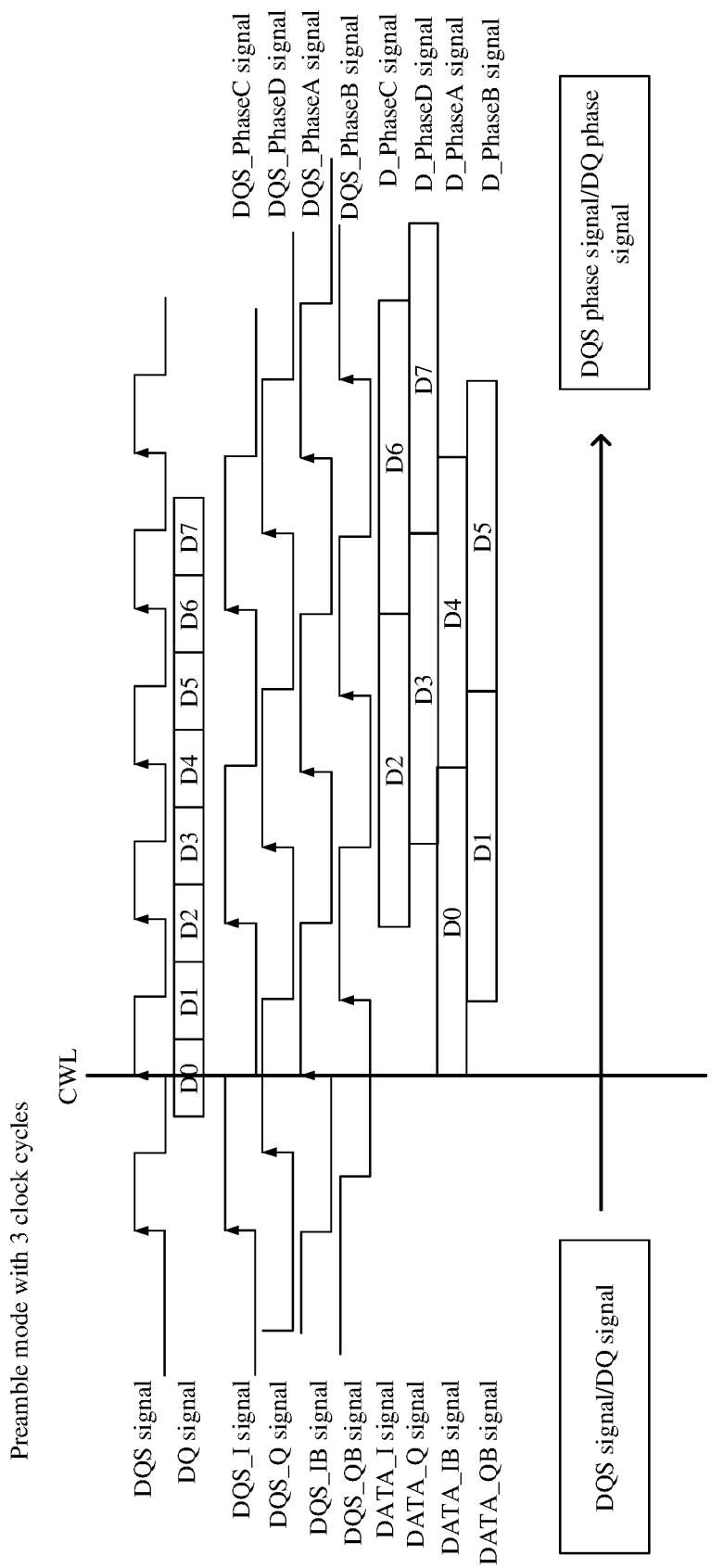
FIG. 8 is a diagram of a signal timing of a data sampling circuit according to an embodiment of the present disclosure.

Exemplarily, referring to FIG. 8, it shows a diagram of a signal timing of a data sampling circuit 30 according to an embodiment of the present disclosure. As shown in FIG. 8, the DQS signal represents the first data sampling signal, the DQ signal represents the first data signal, and the DQ signal may include D0, D1, D2, D3, D4, D5, D6, D7. In addition, the four second data sampling signals associated with the respective phases obtained by the DQS signal after passing through the frequency dividing circuit are respectively the DQS_I signal, the DQS_Q signal, the DQS_IB signal and the DQS_QB signal; and the four second data signals associated with the respective phases obtained by the DQ signal after passing through the sampling circuit are the DATA_I signal, the DATA_Q signal, the DATA_IB signal and the DATA_QB signal.

Herein, each of clock cycles of the DQS_I signal, the DQS_Q signal, the DQS_IB signal and the DQS_QB signal becomes twice a clock cycle of the original DQS signal, then the outputs thereof are D2 and D6 for the DATA_I signal; the outputs are D3 and D7 for the DATA_Q signal; the outputs are D0 and D4 for the DATA_IB signal; and the outputs are D1 and D5 for the DATA_QB signal.

Specifically, taking the preamble mode with 3 clock cycles, which is indicated by the preamble information, as an example, the initial state, that is, the second data sampling signal corresponding to the phase A, can be determined according to the preamble pattern; and the second data sampling signal corresponding to the phase A is represented in FIG. 8 by DQS_PhaseA signal, which is namely the DQS_IB signal. Then, the second data sampling signal corresponding to the phase B (represented by the DQS_PhaseB signal) is the DQS_QB signal, the second data sampling signal corresponding to the phase C (represented by the DQS_PhaseC signal) is the DQS_I signal, and the second data sampling signal corresponding to the phase D (represented by the DQS_PhaseD signal) is the DQS_Q signal. Similarly, the second data signal corresponding to the phase A is represented by the D_PhaseA signal in FIG. 8, then the D_PhaseA signal is the DATA_IB signal. Then, the second data signal corresponding to the phase B (represented by the D_PhaseB signal) is the DATA_QB signal, the second data signal corresponding to the phase C (represented by the D_PhaseC signal) is the DATA_I signal, and the second data signal corresponding to the phase D (represented by the D_PhaseD signal) is the DATA_Q signal. That is to say, for the DQS signal/DQ signal output from the DQS/DQ input buffer, the DQS phase signal/DQ phase signal may be determined based on the signal timing shown in FIG. 8. Herein, the DQS phase signal includes the DQS_PhaseA signal, the DQS_PhaseB signal, the DQS_PhaseC signal and the DQS_PhaseD signal; and the DQ phase signal includes the D_PhaseA signal, the D_PhaseB signal, the D_PhaseC signal and the D_PhaseD signal.

Furthermore, according to the MRS information, the target data sampling signal can be determined from the DQS_PhaseA signal, the DQS_PhaseB signal, the DQS_PhaseC signal and the DQS_PhaseD signal, and the target data signal can be determined from the D_PhaseA signal, the D_PhaseB signal, the D_PhaseC signal and the D_PhaseD signal.

Figure 9:
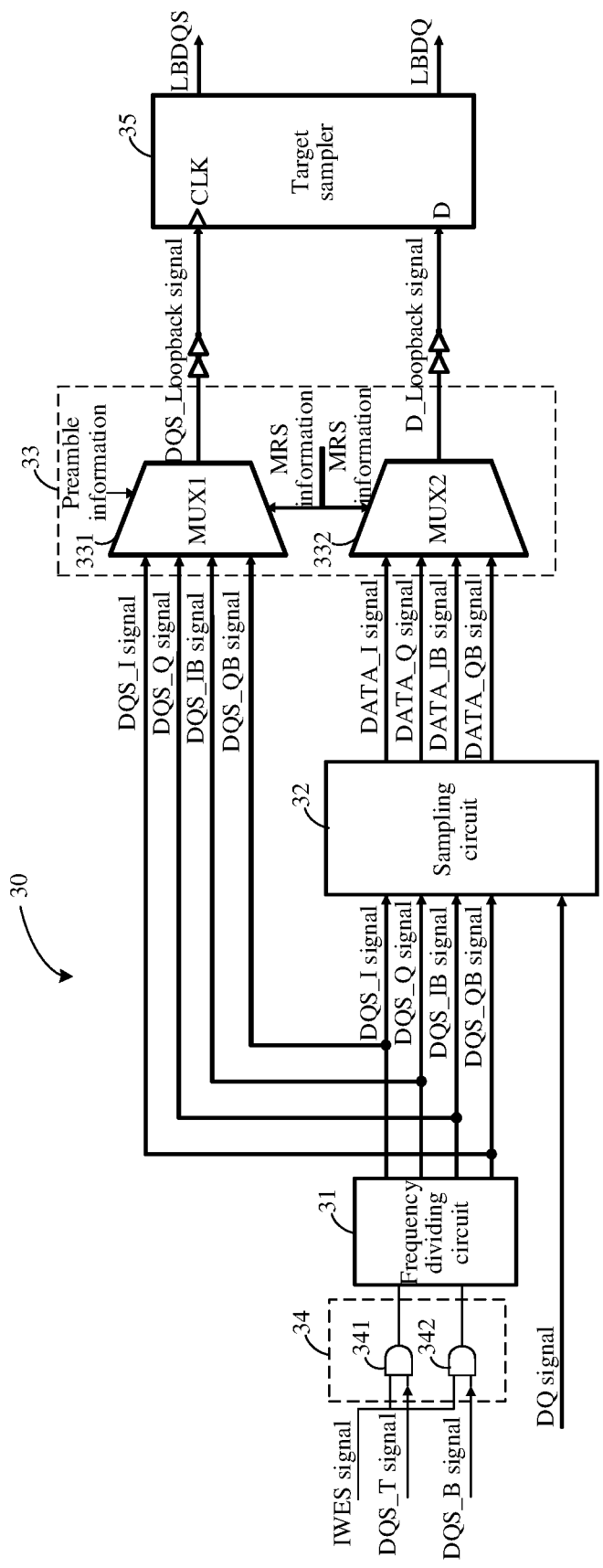
FIG. 9 is a schematic structural diagram of a further data sampling circuit according to an embodiment of the present disclosure.

In addition, after the target data sampling signal and the target data signal are obtained, the target data signal may be sampled again by using the target data sampling signal to achieve further data alignment. Thus, in some embodiments, based on the data sampling circuit 30 shown in FIG. 4, referring to FIG. 9, the data sampling circuit 30 may further include a target sampler 35.

The target sampler 35 is configured to receive the target data sampling signal and the target data signal, and sample the target data signal according to the target data sampling signal to obtain a final data signal and a final clock signal.

It is to be noted that, in the embodiments of the present disclosure, the target sampler 35 may be a D-type flip-flop. Herein, the D-type flip-flop may include an input terminal (D), a clock terminal (CK), a first output terminal and a second output terminal.

Specifically, for the D-type flip-flop, the input terminal (D) is configured to receive the target data signal, the clock terminal (CK) is configured to receive the target data sampling signal, and then after internal sampling processing is performed by the D-type flip-flop, the first output terminal is configured to output the final data signal (represented by LBDQ), and the second output terminal is configured to output the final clock signal (represented by LBDQS). In this way, for a DRAM product, the LBDQ signal and the LBDQS signal are compared with the input DQ signal and the DQS_T/DQS_B signal, so that the bit error rate of the DRAM product can be rapidly tested.

In conclusion, the embodiments of the present disclosure provide a data sampling circuit including the frequency dividing circuit, the sampling circuit and the selection circuit. The frequency dividing circuit is configured to receive a first data sampling signal, and perform frequency dividing processing on the first data sampling signal to obtain the multiple second data sampling signals associated with respective phases. The sampling circuit is configured to receive the multiple second data sampling signals and a first data signal, and sample the first data signal according to the multiple second data sampling signals to obtain the multiple second data signals associated with respective phases. The selection circuit is configured to receive preamble information and MRS information, and select among the multiple second data sampling signals and the multiple second data signals according to the preamble information and the MRS information to obtain a target data sampling signal and a target data signal respectively. In this way, after the multiple second data sampling signals and the multiple second data signals are obtained, the signal corresponding to the target phase can be selected according to the preamble information and the MRS information, which not only solves the problem of phase uncertainty caused by the clock divider, but also enables accurate identification of the phase information and rapid test of the bit error rate of the DRAM product.

Figure 10:
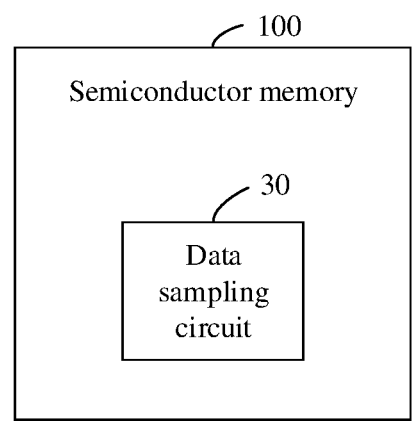
FIG. 10 is a schematic structural diagram of a semiconductor memory according to an embodiment of the present disclosure.

In still another embodiment of the present disclosure, referring to FIG. 10, it shows a schematic structural diagram of a semiconductor memory 100 according to an embodiment of the present application. As shown in GIF. 10, the semiconductor memory 100 may include the data sampling circuit 30 according to any one of the foregoing embodiments.

In the embodiment of the present disclosure, the semiconductor memory 100 may be a DRAM chip.

Furthermore, in some embodiments, the DRAM chip conforms to a memory specification of DDR5.

The embodiments of the present disclosure relates to a data sampling circuit 30 in a DDR5 DRAM chip, and the data sampling circuit 30 can implement the Loopback function for rapidly testing the bit error rate of the DDR5 product.

Specifically, in the embodiments of the present disclosure, since the semiconductor memory 100 includes the data sampling circuit 30, after the multiple second data sampling signals and the multiple second data signals are obtained, the signal corresponding to the target phase can be selected according to the preamble information and the MRS information, which not only solves the problem of phase uncertainty caused by the clock frequency divider, but also enables accurate identification of the phase information and rapid test of the bit error rate of the DRAM product.

The above are merely the preferred embodiments of the present disclosure and are not intended to limit the scope of protection of the present disclosure.

It is to be noted that, in this disclosure, the terms "include", "including" or any other variation thereof, are intended to cover a non-exclusive inclusion, such that a process, method, article, or device that includes a list of elements includes not only those elements but also other elements not expressly listed, or also includes elements inherent to such process, method, article, or device. Without more limitations, an element is defined by the statement "including a . . . " that does not rule out there are additional identical elements in a process, method, article, or apparatus that includes the element.

The above-described embodiments of the present disclosure are for the purpose of description only and do not represent the advantages or disadvantages of the embodiments.

The methods disclosed in the method embodiments provided in this disclosure can be arbitrarily combined without conflict to obtain new method embodiments.

The features disclosed in the product embodiments provided in this disclosure can be arbitrarily combined without conflict to obtain new product embodiments.

The features disclosed in the method or apparatus embodiments provided in this disclosure can be arbitrarily combined without conflict to obtain new method embodiments or apparatus embodiments.

The above is only the specific embodiments of the disclosure, but the scope of protection of the disclosure is not limited to this. Any person skilled in the technical field who can easily think of change or replacement within the technical scope of the disclosure shall be covered in the scope of protection of the disclosure. Therefore, the protection scope of the disclosure shall be subject to the protection scope of the claims.

The invention claimed is:

1. A data sampling circuit, comprising a frequency dividing circuit, a sampling circuit and a selection circuit,
   wherein the frequency dividing circuit is configured to receive a first data sampling signal, and perform frequency dividing processing on the first data sampling signal to obtain a plurality of second data sampling signals associated with respective phases;
   the sampling circuit is configured to receive the plurality of second data sampling signals and a first data signal, and sample the first data signal according to the plurality of second data sampling signals to obtain a plurality of second data signals associated with respective phases; and
   the selection circuit is configured to receive preamble information and mode register set (MRS) information, and select among the plurality of second data sampling signals and the plurality of second data signals according to the preamble information and the MRS information to obtain a target data sampling signal and a target data signal respectively.

2. The data sampling circuit of claim 1, wherein
   the plurality of second data sampling signals comprises: a second data sampling signal associated with a first phase, a second data sampling signal associated with a second phase, a second data sampling signal associated with a third phase, and a second data sampling signal associated with a fourth phase; and
   the plurality of second data signals comprises: a second data signal associated with the first phase, a second data signal associated with the second phase, a second data signal associated with the third phase, and a second data signal associated with the fourth phase.

3. The data sampling circuit of claim 2, wherein
   the first phase is 0 degree, the second phase is 90 degrees, the third phase is 180 degrees, and the fourth phase is 270 degrees.

4. The data sampling circuit of claim 1, further comprising an enable control circuit connected to the frequency dividing circuit,
   wherein the enable control circuit is configured to receive an initial data sampling signal and a write enable signal, and perform a logic operation on the initial data sampling signal and the write enable signal to obtain the first data sampling signal.

5. The data sampling circuit of claim 4, wherein the first data sampling signal comprises a first forward data sampling signal and a first complementary data sampling signal, wherein the enable control circuit is specifically configured to generate the first forward data sampling signal and the first complementary data sampling signal when the write enable signal is in a first level state, a phase difference between the first forward data sampling signal and the first complementary data sampling signal being 180 degrees.

6. The data sampling circuit of claim 5, wherein the initial data sampling signal comprises a forward data sampling signal and a complementary data sampling signal, a phase difference between the forward data sampling signal and the complementary data sampling signal being 180 degrees, and the enable control circuit comprising a first AND gate and a second AND gate,
   wherein the first AND gate is configured to receive the forward data sampling signal and the write enable signal, and perform an AND operation on the forward data sampling signal and the write enable signal to obtain the first forward data sampling signal; and
   the second AND gate is configured to receive the complementary data sampling signal and the write enable signal, and perform an AND operation on the complementary data sampling signal and the write enable signal to obtain the first complementary data sampling signal.

7. The data sampling circuit of claim 3, wherein the selection circuit comprises a first selection module and a second selection module,
   wherein the first selection module is configured to receive the preamble information and the MRS information, and select among the plurality of second data sampling signals respectively according to the preamble information and the MRS information to obtain the target data sampling signal; and
   the second selection module is configured to receive the preamble information and the MRS information, and select among the plurality of second data signals respectively according to the preamble information and the MRS information to obtain the target data signal.

8. The data sampling circuit of claim 7, wherein the first selection module comprises a first selection sub-module and a second selection sub-module,
   wherein the first selection sub-module is configured to receive the preamble information, and select among the plurality of second data sampling signals according to the preamble information to obtain second data sampling signals respectively corresponding to phases A, B, C and D; and
   the second selection sub-module is configured to receive the MRS information, select among the second data sampling signals respectively corresponding to the phases A, B, C and D according to the MRS information, and take a selected second data sampling signal corresponding to a target phase as the target data sampling signal.

9. The data sampling circuit of claim 8, wherein
   the first selection sub-module is specifically configured to, when the preamble information is used for indicating a first preamble mode, determine that the second data sampling signals respectively corresponding to the phases A, B, C and D are the second data sampling signal associated with the third phase, the second data sampling signal associated with the fourth phase, the second data sampling signal associated with the first phase, and the second data sampling signal associated with the second phase; or,
   the first selection sub-module is specifically configured to, when the preamble information is used for indicating a second preamble mode, determine that the second data sampling signals respectively corresponding to the phases A, B, C and D are the second data sampling signal associated with the third phase, the second data sampling signal associated with the fourth phase, the second data sampling signal associated with the first phase, and the second data sampling signal associated with the second phase; or,
   the first selection sub-module is specifically configured to, when the preamble information is used for indicating a third preamble mode, determine that the second data sampling signals respectively corresponding to the phases A, B, C and D are the second data sampling signal associated with the first phase, the second data sampling signal associated with the second phase, the second data sampling signal associated with the third phase, and the second data sampling signal associated with the fourth phase.

10. The data sampling circuit of claim 9, wherein
    the second selection sub-module is specifically configured to, when the MRS information has a first value, determine that the target phase is the phase A, and take the second data sampling signal corresponding to the phase A as the target data sampling signal; or,
    the second selection sub-module is specifically configured to, when the MRS information has a second value, determine that the target phase is the phase B, and take the second data sampling signal corresponding to the phase B as the target data sampling signal; or,
    the second selection sub-module is specifically configured to, when the MRS information has a third value, determine that the target phase is the phase C, and take the second data sampling signal corresponding to the phase C as the target data sampling signal; or,
    the second selection sub-module is specifically configured to, when the MRS information has a fourth value, determine that the target phase is the phase D, and take the second data sampling signal corresponding to the phase D as the target data sampling signal.

11. The data sampling circuit of claim 7, wherein the second selection module comprises a third selection sub-module and a fourth selection sub-module,
    wherein the third selection sub-module is configured to receive the preamble information, and select among the plurality of second data signals according to the preamble information to obtain second data signals respectively corresponding to phases A, B, C and D; and
    the fourth selection sub-module is configured to receive the MRS information, select among the second data signals respectively corresponding to the phases A, B, C and D according to the MRS information, and take a selected second data signal corresponding to a target phase as the target data signal.

12. The data sampling circuit of claim 11, wherein
    the third selection sub-module is specifically configured to, when the preamble information is used for indicating a first preamble mode, determine that the second data signals respectively corresponding to the phases A, B, C and D are the second data signal associated with the third phase, the second data signal associated with the fourth phase, the second data signal associated with the first phase, and the second data signal associated with the second phase; or
    the third selection sub-module is specifically configured to, when the preamble information is used for indicating a second preamble mode, determine that the second data signals respectively corresponding to the phases A, B, C and D are the second data signal associated with the third phase, the second data signal associated with the fourth phase, the second data signal associated with the first phase, and the second data signal associated with the second phase; or the third selection sub-module is specifically configured to, when the preamble information is used for indicating a third preamble mode, determine that the second data signals respectively corresponding to the phases A, B, C and D are the second data signal associated with the first phase, the second data signal associated with the second phase, the second data signal associated with the third phase, and the second data signal associated with the fourth phase.

13. The data sampling circuit of claim 12, wherein
the fourth selection sub-module is specifically configured to, when the MRS information has a first value, determine that the target phase is the phase A, and take the second data signal corresponding to the phase A as the target data signal; or the fourth selection sub-module is specifically configured to, when the MRS information has a second value, determine that the target phase is the phase B, and take the second data signal corresponding to the phase B as the target data signal; or the fourth selection sub-module is specifically configured to, when the MRS information has a third value, determine that the target phase is the phase C, and take the second data signal corresponding to the phase C as the target data signal; or the fourth selection sub-module is specifically configured to, when the MRS information has a fourth value, determine that the target phase is the phase D, and take the second data signal corresponding to the phase D as the target data signal.

14. The data sampling circuit of claim 9, wherein
the first preamble mode is a preamble mode with 2 clock cycles;

the second preamble mode is a preamble mode with 3 clock cycles; and the third preamble mode is a preamble mode with 4 clock cycles.

15. The data sampling circuit of claim 10, wherein
the first value is 00, the second value is 01, the third value is 10, and the fourth value is 11.

16. A semiconductor memory, comprising a data sampling circuit of claim 1.

17. The semiconductor memory of claim 16, wherein the semiconductor memory is a dynamic random access memory (DRAM) chip.

18. The semiconductor memory of claim 17, wherein the DRAM chip conforms to a memory specification of 5th Double Data Rate (DDR5).

* * * * *